United States Patent [19]

Nakazato et al.

[11] Patent Number: 4,825,281

[45] Date of Patent: Apr. 25, 1989

[54] BIPOLAR TRANSISTOR WITH SIDEWALL BARE CONTACT STRUCTURE

[75] Inventors: Kazuo Nakazato, Kokubunji; Tohru Nakamura, Houya; Masatoshi Matsuda, Fuchu; Takao Miyazaki, Hachioji; Tokuo Kure, Kokubunji; Takahiro Okabe, Nishitama; Minoru Nagata, Kodaira, all of Japan

[73] Assignee: Hitachi, Ltd., Tokyo, Japan

[21] Appl. No.: 435,552

[22] Filed: Oct. 21, 1982

[30] Foreign Application Priority Data

Oct. 28, 1981 [JP] Japan .................. 56-171443

[51] Int. Cl.[4] .................. H01L 29/72; H01L 29/34; H01L 29/04; H01L 23/48
[52] U.S. Cl. .................. 357/59; 357/34; 357/54; 357/67; 357/71
[58] Field of Search .................. 357/34, 59, 71 S, 35, 357/67

[56] References Cited

U.S. PATENT DOCUMENTS

| | | | |
|---|---|---|---|
| 3,796,613 | 3/1974 | Magdo et al. | 357/34 |
| 4,252,581 | 2/1981 | Anantha et al. | 357/59 |
| 4,276,557 | 6/1981 | Levinstein et al. | 357/71 S |
| 4,303,933 | 12/1981 | Horng et al. | 357/59 |
| 4,396,933 | 8/1983 | Magdo et al. | 357/59 |

OTHER PUBLICATIONS

T. I. Kamins, "Chemically Vapor Deposited Polycrystalline-Silicon Films", *IEEE Transactions on Parts, Hybrids, and Packaging,* vol. PHP-10 (1974), pp. 221-229.
R. D. Davies, "Poly I$^2$L Integrated Circuit Technology for Compatible Analog and Digital Signal Processing", *Stanford Electronics Laboratories Technical Report,* No. 4958-7, Apr. 1978, pp. 51-62.
T. I. Kamins et al., "Structure of Chemically Deposited Polycrystalline-Silicon Films", *Thin Solid Films,* vol. 16(1973), pp. 147-165.
I. Kobayashi, "A New Technology for High-Power IC", *IEEE Transactions on Electron Devices,* vol. ED-18(1971), pp. 45-49.

*Primary Examiner*—J. Carroll
*Attorney, Agent, or Firm*—Antonelli, Terry & Wands

[57] ABSTRACT

A semiconductor device wherein the active regions of a transistor are formed in an opening provided in an insulating film, electrodes are led out by a polycrystalline silicon film formed on the insulating film, and the upper surfaces of the emitter and base electrodes and the exposed surface of the insulating film are substantially even.

5 Claims, 5 Drawing Sheets

BIPOLAR TRANSISTOR WITH SIDEWALL BARE CONTACT STRUCTURE

BACKGROUND OF THE INVENTION

1. Field of the Invention

The present invention relates to semiconductor devices, and more particularly to a semiconductor device which is capable of high-speed switching and which is well suited for forming multi-level interconnections owing to a small required area and reduced surface roughness.

2. Description of the Prior Art

As is well known, the switching speed of a bipolar transistor is greatly affected by the size of a base-collector junction. It has therefore been proposed to enhance the switching speed by making the size of the base-collector junction small.

FIG. 1 shows an example of such proposed device. A p-type substrate 11 has a surface region in which an n+-type buried layer 12 is provided. The surface of the n+-type buried layer 12 is formed with an insulating film (SiO$_2$ film) 17 having a plurality of openings. An n-p-n transistor which consists of an n-type collector 13, a p-type base 14 and an n-type emitter 15 is provided in a predetermined one of the openings. The collector 13 is connected to a collector electrode 10" through the n+-type buried layer 12, while the base 14 is connected to a base electrode 10' through a polycrystalline silicon film 18 which is deposited on the insulating film 17.

The bipolar transistor having such structure has the merit that, since the p-n junction between the base 14 and the collector 13 is small as apparent from FIG. 1, the parasitic capacitance is small enough to realize a high-speed switching operation.

Since, however, the polycrystalline silicon film 18 is used as a base lead-out electrode, i.e., the interconnection between the base electrode 10' and the intrinsic base region 14, and an emitter electrode 10, the base electrode 10' and an insulating film (SiO$_2$ film) 19 are formed on the polycrystalline silicon film 18, comparatively great steps (of approximately 1.5 μm) exist between the electrodes 10, 10' and the insulating film 19, and the collector electrode 10" and the insulating film 17 which are formed directly on the silicon substrate. Therefore, when multi-level interconnections are formed on the steps, the parts corresponding to the steps are liable to break, so that the reliability of the semiconductor device degrades drastically.

SUMMARY OF THE INVENTION

An object of the present invention is to solve the problem of the prior art described above, and to provide a semiconductor device which is capable of high-speed switching and whose topside has steps small enough to form multi-level interconnections with ease.

To the accomplishment of the object, the present invention releaves the steps in such a way that an epitaxial silicon layer is interposed between a silicon substrate and a metal electrode (10" in FIG. 1) which has heretofore been formed directly on the silicon substrate (a buried layer 12) and that a further insulating film is stacked on an insulating film (17) which has been formed on the silicon substrate.

DETAILED DESCRIPTION OF THE PREFERRED EMBODIMENTS

Figure 2:
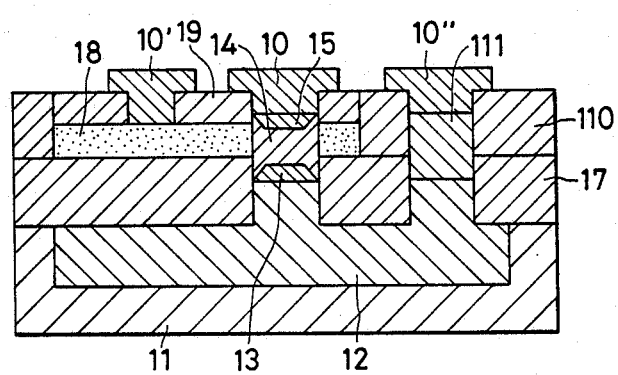
FIG. 2 is a view showing the sectional structure of the essential portions of an emodiment of the present invention.

Embodiment 1:

FIG. 2 is a sectional view showing the essential portions of an embodiment of the present invention.

Figure 1:
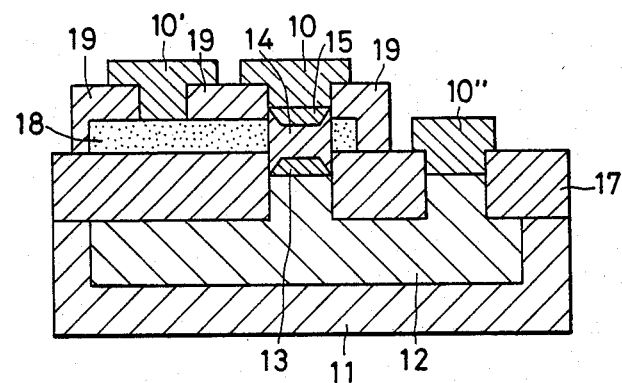
FIG. 1 is a view showing the sectional structure of the essential portions of a prior-art bipolar transistor.

Likewise to the transistor shown in FIG. 1, the bipolar transistor of FIG. 2 is a vertical n-p-n bipolar transistor which includes a collector 13, a base 14 and an emitter 15.

A base electrode 10' is connected to a side part of the base 14 through a polycrystalline silicon film 18, while an emitter electrode 10 is connected directly on the emitter 15.

Unlike the prior art, however, an epitaxial silicon layer 111 is interposed between a collector electrode 10" and an n+-type buried layer 12. In addition, a third insulating film (SiO$_2$ film) 110 is deposited on the exposed part of a first insulating film 17.

As apparent from FIG. 2, therefore, the upper surface of the collector electrode 10" becomes even with the upper surfaces of the emitter electrode 10 and the base electrode 10', and also the upper surfaces of a second insulating film 19 and the third insulating film 110 become even.

As a result, when compared with the prior-art bipolar transistor shown in FIG. 1, the bipolar transistor of the present invention has the steps reduced conspicuously and its topside flattened, so that the breaking of interconnections is feared much less. It is therefore possible to form the multi-level interconnections without anxiety.

Now, a method of manufacturing the transistor of the structure shown in FIG. 2 will be described by referring also to FIGS. 3a–3d.

Figure 3A:
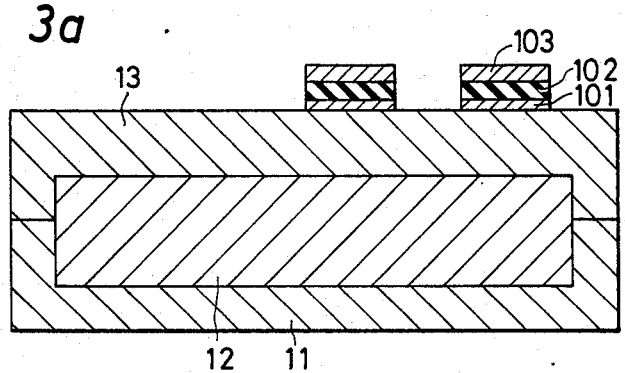
FIGS. 3a to 3d are processing step diagrams showing an example of a manufacturing process for the semiconductor device according to the present invention.

First, as shown in FIG. 3a, and n+-type buried layer 12 is formed on a p-type Si substrate 11 by a well-known expedient such as ion implantation and thermal diffusion, whereupon an epitaxial Si layer 13 is formed by the well-known vapor epitaxial growth technique. After an SiO$_2$ film 101, an Si$_3$N$_4$ film 102 and an SiO$_2$ film 103 have been stacked and formed on the whole surface, those parts of the deposited SiO$_2$ film 101, Si$_3$N$_4$ film 102 and SiO$_2$ film 103 which do not overlie parts for forming the active regions and collector lead-out region of a vertical transistor therein are removed by the reactive ion etching.

Figure 3B:
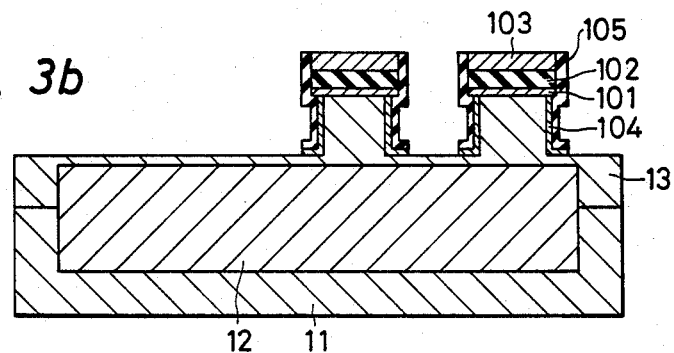

Subsequently, as shown in FIG. 3b, the exposed parts of the epitaxial Si layer 13 are etched and removed by the reactive ion etching by employing the three layers of the insulating films 101, 102 and 103 as a mask. In this case, the etching may be performed until the buried layer 12 is exposed, or so that the epitaxial Si layer 13 is slightly left on the upper surface of the buried layer 12 as illustrated in FIG. 3b.

The parts of the epitaxial Si layer 13 underlying the three-layer insulating films 101, 102 and 103 are side-etched by the wet etching, to form structures in which the three-layer insulating films 101, 102 and 103 overhang. Although this step of side etching is not always indispensable, it should preferably be carried out because the overhang structures are effective for leaving an $Si_3N_4$ film 105 on the side surfaces of parts of the epitaxial Si layer 13 in succeeding steps.

An $SiO_2$ film 104 is formed on the upper surface of the epitaxial Si layer 13 and the surfaces of the overhang structure parts thereof by the well-known thermal oxidation, whereupon the $Si_3N_4$ film 105 is further stacked and formed on the $SiO_2$ film 104 by the well-known CVD (chemical vapor deposition) process.

The $Si_3N_4$ film 105 deposited on parts other than the side surfaces of the three-layer insulating films 101, 102 and 103 and the parts of the epitaxial Si layer 13 underlying these insulating films is etched and removed, whereupon the exposed parts of the $SiO_2$ film 104 are further etched and removed. Thus, as illustrated in FIG. 3b, the $SiO_2$ film 104 and the $Si_3N_5$ film 105 remain on the side surfaces of the overhang structure parts of the epitaxial layer 13, and the $Si_3N_4$ film 105 remains on the side surfaces of the three-layer insulating films 101, 102 and 103.

Figure 3C:
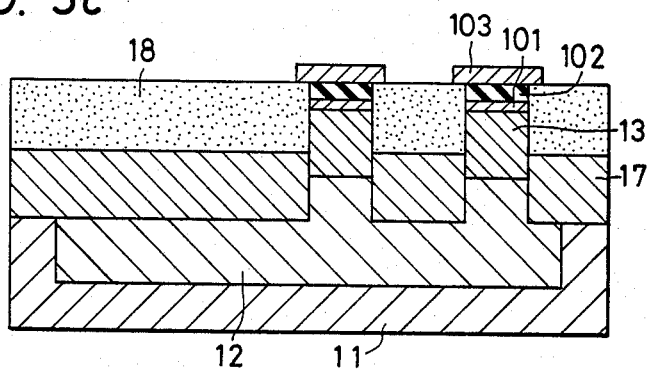

As shown in FIG. 3c, a thick $SiO_2$ film (having a thickness of about 1 $\mu$m) 17 is formed by the well-known thermal oxidation. Thereafter, the $SiO_2$ layer 104 and the $Si_3N_4$ film 105 are etched and removed. A polycrystalline silicon film 18 is deposited on the whole area, and is thereafter patterned so as to remove its parts deposited on the remaining parts of the $SiO_2$ film 103. Thus, as illustrated in FIG. 3c, a recess between the remaining parts of the epitaxial Si layer 13 is filled up with the polycrystalline silicon film 18.

Figure 3D:
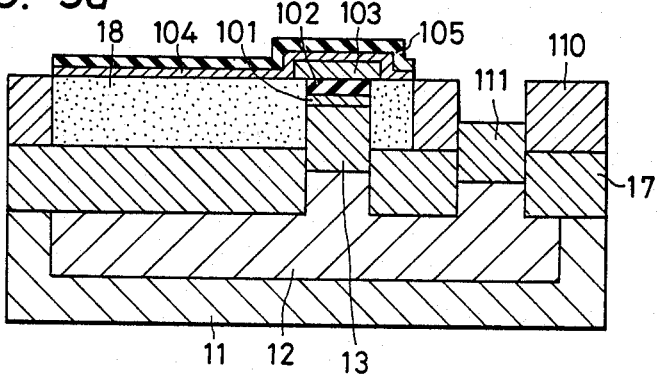

An $SiO_2$ film 104 and an $Si_3N_4$ film 105 are stacked and deposited on the whole area. Thereafter, etching is performed so that, as illustrated in FIG. 3d, the parts of the $SiO_2$ film 104 and the $Si_3N_4$ film 105 deposited on regions to form an emitter electrode and a base lead-out electrode therein may be left behind, whereas the parts deposited on the other regions may be removed.

The thermal oxidation is performed to oxidize the exposed parts of the polycrystalline silicon film 18 and to form an $SiO_2$ film 110.

The $SiO_2$ film 103, $Si_3N_4$ film 102 and $SiO_2$ film 101, which are deposited on the part to form the collector lead-out electrode therein, are successively etched and removed. Thereafter, the exposed epitaxial Si layer 13 is heavily doped with an impurity so as to form the collector lead-out semiconductor layer 111 of low resistance.

The $SiO_2$ film 104 and the $Si_3N_4$ film 105 used as a mask in the above oxidizing step are removed to expose the upper surface of the polycrystalline silicon film 18.

A p-type impurity is introduced into the exposed part of the polycrystalline silicon film 18 by the thermal diffusion or ion implantation, to turn the part into a low resistance. Thereafter, the surface of the polycrystalline silicon film 18 is oxidized to form an $SiO_2$ film 19. (FIG. 2)

After etching and removing the $SiO_2$ film 103, $Si_3N_4$ film 102 and $SiO_2$ film 101 deposited on the epitaxial Si layer 13, a base 14 and an emitter 15 are formed by a well-known method.

After desired parts of the $SiO_2$ film 19 have been etched to form contact windows, the emitter electrode 10, base electrode 10' and collector electrode 10" made of conductive metal films of Al or the like are formed. Then, the n-p-n vertical bipolar transistor shown in FIG. 2 is formed.

In this transistor, not only the upper surfaces of the emitter electrode 10, base electrode 10' and collector electrode 10", but also those of the $SiO_2$ film 19 and $SiO_2$ film 110 are substantially even. The steps are relieved much more than in the prior-art bipolar transistor shown in FIG. 1, and the multi-level interconnections are permitted.

The bipolar transistor of the embodiment has such other merits that, since the base-collector junction is small, the parasitic capacitance is low and a high switching speed is possible, and that, since the $SiO_2$ film 17 serves also for the isolation between the respectively adjacent transistors, any isolation means need not be added and the required area is small.

Figure 4:
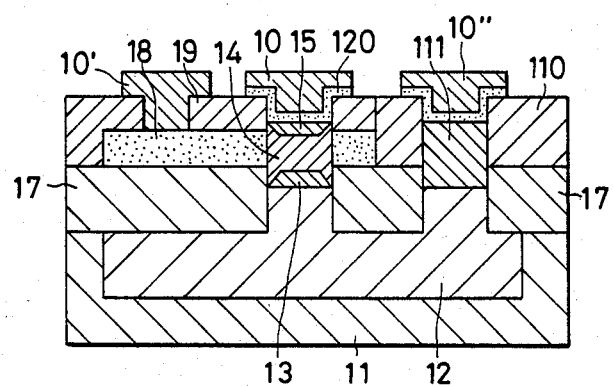
FIGS. 4 to 7 are sectional views showing different embodiments of the present invention, respectively.

Embodiment 2:

An embodiment shown in FIG. 4 is such that a polycrystalline silicon film 120 is interposed between an emitter 15 and an emitter electrode 10.

With this measure, metal atoms which constitute the emitter electrode 10 are prevented from diffusing through the emitter 15 and entering a base 14.

Thus, the emitter 15 can be made as very thin as about 0.1–0.3 $\mu$m, so that a still higher switching operation is permitted.

Figure 5:
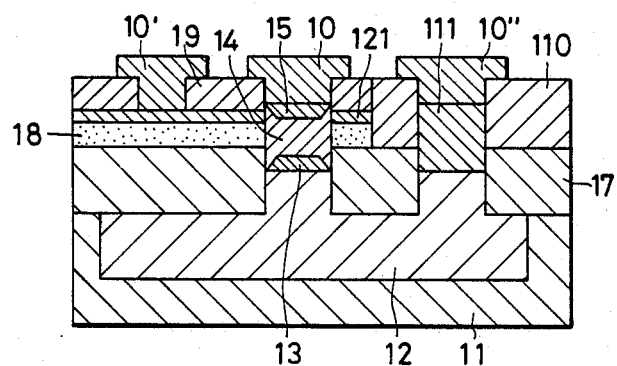

Embodiment 3:

An embodiment shown in FIG. 5 is such that a film 121 of a metal silicide, e.g., $MoSi_2$ is disposed on a polycrystalline silicon film 18.

This measure lowers the interconnection resistance, enhances the switching speed and reduces the power consumption.

Figure 6:
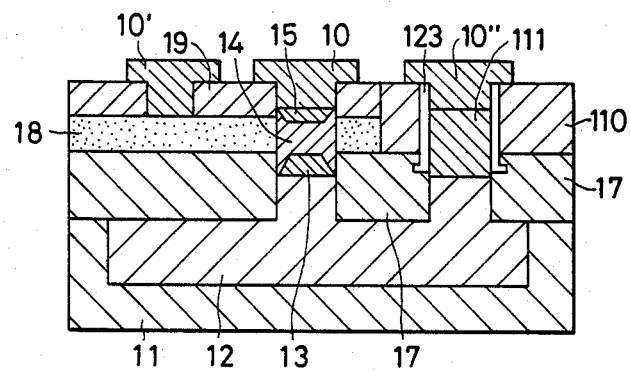

Embodiment 4:

An embodiment shown in FIG. 6 has a structure in which a stacked film 123 consisting of an $SiO_2$ film 104 and an $Si_3N_4$ film 105 is left on the side surface of a collector leading-out epitaxial Si layer 111.

This measure is very effective for the miniaturization of the transistor as described below. In forming an $SiO_2$ film 110 by oxidizing a polycrystalline silicon film 18 by the thermal oxidation, the side part of an epitaxial Si layer is prevented from being oxidized, so that the collector leading-out epitaxial Si layer 111 does not become slender.

Embodiment 5:

For the sake of convenience, all the foregoing embodiments have been explained as to the vertical transistors. Needless to say, however, the present invention is not restricted to such vertical transistors, but it is also applicable to a lateral transistor or to a semiconductor device in which a vertical transistor and a lateral transistor are formed on an identical semiconductor substrate.

Figure 7:
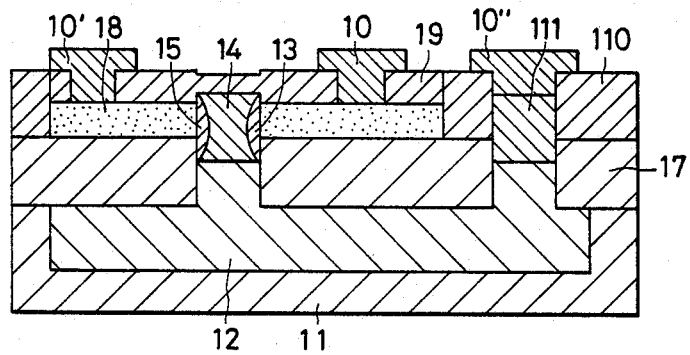

FIG. 7 shows an embodiment in which the present invention is applied to a lateral transistor.

As apparent from FIG. 7, in the case where the present invention is applied to the lateral transistor, an emitter and a collector are led out by interconnections of a polycrystalline silicon film 18, and a base is led out by a buried layer 12 and an epitaxial Si layer of low resistance 111.

The construction other than the collector 13, base 14 and emitter 15 is the same as in the case of the vertical transistor, and it can be formed by the same manufacturing steps as in the foregoing.

What is claimed is:

1. A semiconductor device comprising a first insulating film which is formed on a surface region of a semiconductor substrate and which has a plurality of openings; an active transistor region having an emitter, a base and a collector, said active transistor region being formed in a semiconductor region protruding from said semiconductor substrate into one of said openings of said first insulating film; a polycrystalline silicon film which is formed on a desired area of said first insulating film in contact with a side part of said base; a first electrode which is connected to said semiconductor substrate in another of said openings of said first insulating film; a second insulating film which is deposited on said polycrystalline silicon film and on the first insulating film near to said polycrystalline silicon film and which has a plurality of openings; a second electrode which is connected to said polycrystalline silicon film in a desired one of said openings of said second insulating film; and a third electrode which is connected to an upper exposed area of said active transistor region in another of said openings of said second insulating film; a semiconductor layer of low resistance being interposed between said first electrode and said semiconductor substrate; a third insulating film being formed on an exposed surface of said first insulating film, wherein an $SiO_2$ film and an $Si_3N_4$ film are stacked and deposited on a side part of said semiconductor layer of low resistance.

2. A semiconductor device according to claim 1, wherein upper surfaces of said first electrode, said second electrode and said third electrode are substantially even with one another.

3. A semiconductor device according to claim 1 or 2, wherein said second and third insulating films are substantially even with one another.

4. A semiconductor device according to claim 1 or 2, wherein a polycrystalline silicon film is interposed between said upper exposed area of said active transistor region and said third electrode.

5. A semiconductor device according to claim 1 or 2, wherein a metal silicide film is deposited on said polycrystalline silicon film.

* * * * *